United States Patent [19]

Kobatake et al.

[11] Patent Number: 4,876,462
[45] Date of Patent: Oct. 24, 1989

[54] CONTROL CIRCUIT FOR MULTIPURPOSE INPUT TERMINAL

[75] Inventors: Hiroyuki Kobatake; Toshikatsu Jinbo, both of Tokyo, Japan

[73] Assignee: NEC Corporation, Tokyo, Japan

[21] Appl. No.: 200,103

[22] Filed: May 31, 1988

[30] Foreign Application Priority Data

May 29, 1987 [JP] Japan ............................ 62-136895

[51] Int. Cl.$^4$ ................ H03K 17/56; H03K 17/60
[52] U.S. Cl. ............................. 307/246; 307/572; 307/578; 307/582; 307/482
[58] Field of Search ............... 307/246, 482, 570, 571, 307/572, 573, 574, 578, 240, 443, 582

[56] References Cited

U.S. PATENT DOCUMENTS 4,527,074 7/1985 Donaldson et al. ............... 307/574

Primary Examiner—Stanley D. Miller
Assistant Examiner—Timothy P. Callahan
Attorney, Agent, or Firm—Sughrue, Mion, Zinn, Macpeak & Seas

[57] ABSTRACT

A control circuit provided in association with a multipurpose input node is provided with an input signal detecting circuit for relaying a middle voltage level from the multipurpose input node to the internal circuit, a charge-pump circuit activated in the presence of a high voltage level for producing an extremely high voltage level, a transferring circuit coupled between the multipurpose input node and the charge-pump circuit, and a gate transistor coupled between the multipurpose input node and the output node, and the extremely high voltage level is supplied to not only the gate transistor but also the transferring circuit, so that the high voltage level is fully transferred to the charge-pump circuit, thereby allowing the gate transistor to transfer the high voltage level to the output node without any reduction in voltage level.

12 Claims, 4 Drawing Sheets

PRIOR-ART

CONTROL CIRCUIT FOR MULTIPURPOSE INPUT TERMINAL

FIELD OF THE INVENTION

This invention relates to a control circuit for a multipurpose input terminal incorporated in a semiconductor integrated circuit and, more particularly, to a control circuit operative to couple the multipurpose input terminal to one of different destinations.

BACKGROUND OF THE INVENTION

A typical example of the control circuit incorporated in a semiconductor integrated circuit is illustrated in FIG. 1 of the drawings. The semiconductor integrated circuit largely comprises a multipurpose input terminal 1 coupled in parallel to an input signal detecting circuit 2 and an output terminal 3, an inverter circuit 4 operative to produce the inverse of a defecting signal S1 appearing at a control node 5, a charge-pump circuit 6, and a gate transistor formed by an n-channel enhancement-mode MOS-type field effect transistor 7. The multipurpose input terminal 1 is supplied with an input signal S2 or a first high voltage level Vpp higher than that of the input signal S2, and the input signal detecting circuit 2 is operative to detect the input signal S2 and transfers the input signal S2 to an internal circuit 8 upon detection of the input signal S2. Moreover, when the input signal detecting circuit 2 finds the input signal S2 applied to the multipurpose input terminal 1, the detecting signal S1 goes up to a certain positive voltage level, however the detecting signal S2 remains in the ground voltage level in the absence of the input signal S2. The charge-pump circuit 6 comprises two gate transistors each formed by an n-channel enhancement-mode MOS-type field effect transistor 9 or 10, and the n-channel enhancement-mode MOS-type field effect transistors 9 and 10 have respective drain nodes coupled to a source of second high voltage level Vcc and a ground terminal, respectively. The charge-pump circuit 6 further comprises three-stages of bootstrap circuits each consisting of an n-channel enhancement-mode MOS-type field effect transistor 11, 12 or 13 and a capacitor 14, 15 or 16, and a clock signal S3 swinging its voltage level between the second high voltage level Vcc and the ground voltage level and the complementary clock signal thereof are applied to the capacitors 14 and 16 and the capacitor 15, respectively. An output node 17 of the charge-pump circuit 6 is provided between the n-channel enhancement-mode MOS-type field effect transistors 10 and 13, and the control signal S1 and the inverse thereof are applied to the respective gate electrodes of the n-channel enhancement-mode MOStype field effect transistors 9 and 10, respectively. The input signal detecting circuit 2, the inverter circuit 4, the charge-pump circuit 6 and the n-channel enhancement-mode MOS-type field effect transistor 7 as a whole constitute a control circuit for the multipurpose input terminal 1.

The prior-art control circuit thus arranged allows the input signal S2 and the first high voltage level Vpp to be selectively transferred from the multipurpose input terminal 1 to the internal circuit 8 and the output terminal 3, respectively. Namely, when the input signal S2 appears at the multipurpose input terminal 1, the input signal detecting circuit 2 transfers the input signal S2 to the internal circuit 8 but the n-channel enhancement-mode MOS-type field effect transistor 7 is turned off with the ground voltage level supplied from the charge-pump circuit 6 because the detecting signal S1 goes up to the certain positive voltage level, thereby allowing the n-channel enhancement-mode MOS-type field effect transistor 10 to turn on. On the other hand, when the first high voltage level Vpp is applied to the multipurpose input terminal 1, the detecting signal S1 remains in the ground voltage level but the inverter circuit 4 produces the inverse signal of the certain positive voltage level, so that the n-channel enhancement-mode MOS-type field effect transistor 9 turns on, and, on the other hand, the n-channel enhancement-mode MOS-type field effect transistor 10 turns off with the detecting signal S1 of the ground voltage level directly supplied form the node 5. When the n-channel enhancement-mode MOS-type field effect transistor 9 turns on, the three-stages of the bootstrap circuits is activated and a voltage level V17 at the output node 17 is increased to an extremely high voltage level Vhh which is higher than the first high voltage level Vpp by at least the threshold voltage of the n-channel enhancement-mode MOS-type field effect transistor 7. Then, the first high voltage level Vpp appears at the output terminal 3 without reduction in voltage level.

In this instance, the charge-pump circuit 6 is provided with the three-stages of the bootstrap circuits, however more than three-stages of the bootstrap circuits are preferable in a practical application. In detail, assuming now that first and second high voltage levels Vpp and Vcc are 12.5 volts and 5.0 volts, respectively, and that each of the n-channel enhancementmode MOS-type field effect transistors has the threshold voltage Vth of 1.0 volt, the extremely high voltage level Vhh boosted up by the three-stages of the bootstrap circuits is calculated as follows $$Vhh = 4 \times (Vcc - Vth) = 16.0 \text{ volts}$$

Then, the first high voltage level Vpp is transferred to the output terminal 3 without reduction in voltage level.

However, if the charge-pump circuit is provided with two-stages of the bootstrap circuits, the extremely high voltage level Vhh is calculated as follows on the same assumptions $$Vhh = 3 \times (Vcc - Vth) = 12.0 \text{ volts}$$

This results in that the first high voltage level Vpp is transferred from the multipurpose input terminal 1 to the output terminal 3 with reduction in voltage level. Thus, a three-stage bootstrap circuit theoretically in recessary to transfer the first high voltage level Vpp without reduction in voltage level.

However, when the control circuit is fabricated on a semiconductor substrate (not shown) together with the internal circuit 8, the extremely high voltage level Vhh should be calculated in consideration of the back gate biasing effect which reduces the effective gate biasing voltage applied to each of the n-channel enhancement-mode MOS-type field effect transistors. Moreover, a design margin should be taken into account, so that four or five-stages of the bootstrap circuits are necessary to produce the extremely high voltage level Vhh sufficient to cause the channel layer to take place in the n-channel enhancement-mode MOS-type field effect transistor 7 for transferring the first high voltage level Vpp without reduction in voltage level. For this reason, a problem is encountered in the prior-art control circuit in that a large real estate is consumed with the charge-pump circuit 6.

SUMMARY OF THE INVENTION

It is therefore an important object of the present invention to provide a control circuit for a multipurpose input terminal which occupies a relatively small real estate.

To accomplish these objects, the present invention proposes to supply the charge-pump circuit with a high voltage level from the multipurpose input terminal.

In accordance with the present invention, there is provided a control circuit for a multipurpose input terminal incorporated in an integrated circuit, the multipurpose input terminal being supplied with an input signal or an electric power different in voltage level from the input signal, comprising: (a) an input signal detecting circuit operative to detect the input signal appearing at the multipurpose input terminal for relaying the input signal to an internal circuit; (b) a first gate transistor responsive to a first control signal for providing a conduction path between the multipurpose input terminal and an output node and having a threshold voltage; (c) a charge-pump circuit carrying out a bootstrap operation in the presence of the electric power for producing the first control signal higher in voltage level than the electric power by at least the threshold voltage of the first gate transistor; and (d) a transferring circuit operative to supply the charge-pump circuit with the electric power used for the bootstrap operation.

The control circuit further may further comprise an inverter circuit supplied with a second control signal for producing the inverse thereof, and the charge-pump circuit may comprise a series combination of a second gate transistor, at least one bootstrap circuit and a third gate transistor coupled between an output node of the transferring circuit and a source of constant voltage producing a constant voltage different in voltage level from the input signal and the electric power. In this implementation, the second and third gate transistors have respective gate electrodes coupled to input and output nodes of the inverter circuit, respectively. However, the charge-pump circuit may have plural-stages of the bootstrap circuits. The bootstrap circuit may be supplied with a clock signal swinging its voltage level between a voltage level appearing at the output node of the transferring circuit and the constant voltage for enhancement of bootstrap efficiency.

For supplying the charge-pump circuit with the electric power, the transferring circuit may comprise a first load transistor with a gate electrode coupled to the multipurpose input terminal and a fourth gate transistor coupled in parallel between the multipurpose input terminal and the charge-pump circuit. By virtue of this arrangement, the fourth gate transistor is supplied with the first control signal from the charge-pump circuit for transferring the electric power without reduction in voltage level.

In another implementation, the control circuit may further comprise a second load transistor coupled in parallel to the first gate transistor between the multipurpose input terminal and the output node, and first and second n-channel depletion-mode field effect transistors coupled between the output node and a positive constant voltage source producing a positive constant voltage level different in voltage level from the electric power and between the output node of the transferring circuit and the positive constant voltage source, the first and second n-channel depletion-mode MOS-type field effect transistors having respective gate electrodes coupled to the input node of the inverter circuit.

BRIEF DESCRIPTION OF THE DRAWINGS

The features and advantages of a control circuit for a multipurpose input terminal according to the present invention will be more clearly understood from the following description taken in conjunction with the accompanying drawings in which.

DESCRIPTION OF THE PREFERRED EMBODIMENTS First Embodiment

Figure 1:
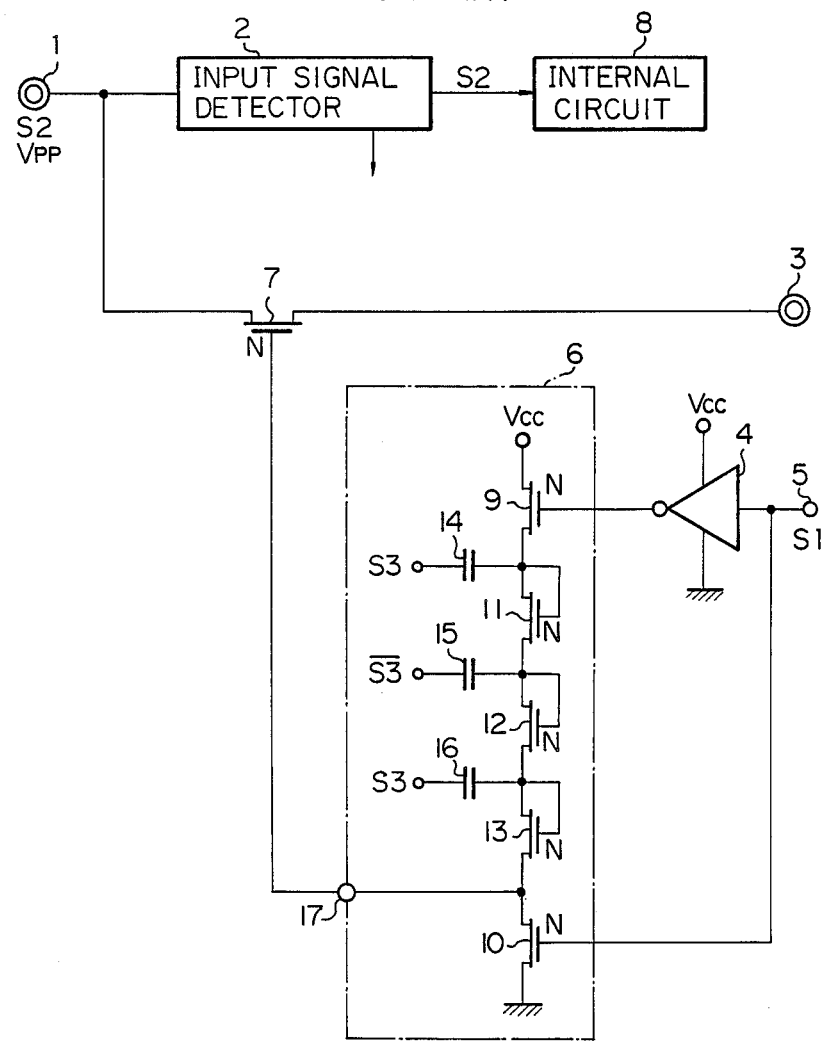
FIG. 1 is a diagram showing the circuit arrangement of a prior-art control circuit for multipurpose input terminal.
Figure 2:
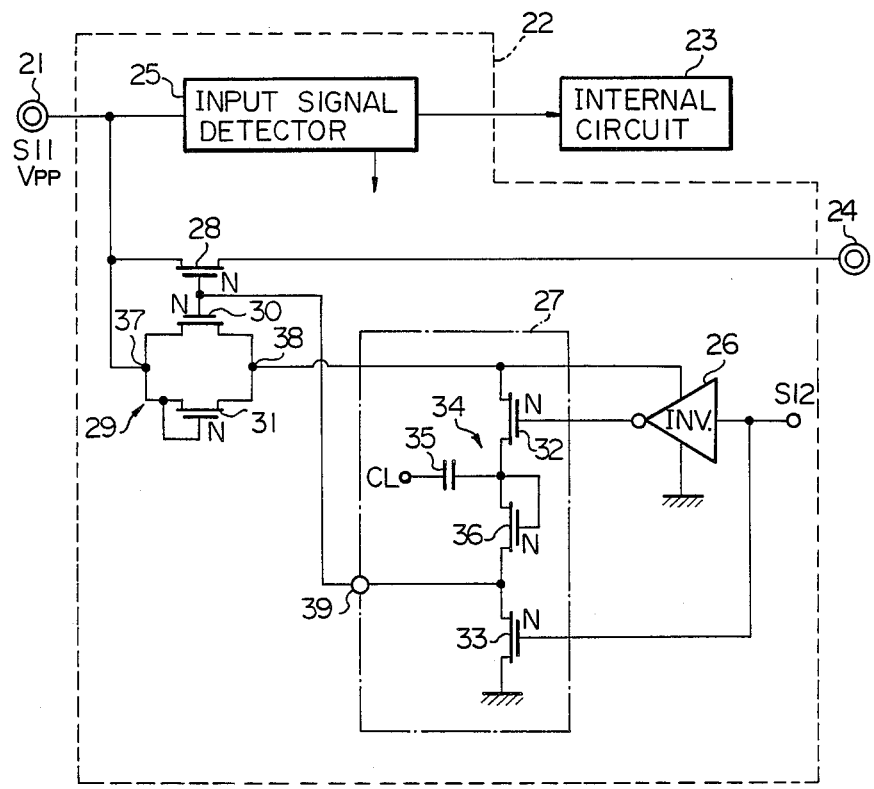
FIG. 2 is a diagram showing the circuit arrangement of an integrated circuit provided with a control circuit for a multipurpose input terminal embodying the present invention.

Referring first to FIG. 2 of the drawings, there is shown the circuit arrangement of an integrated circuit equipped with a control circuit embodying the present invention and fabricated on a single-chip semiconductor substrate. The integrated circuit has a multipurpose input terminal 21, and an electric power of a first high voltage level Vpp of about 12.5 volts or an input signal S11 smaller in voltage level than the electric power are selectively supplied to the multipurpose input terminal 21. The input signal S11 may carry control information of data information for the internal circuit 23. The integrated circuit further comprises a control circuit 22 operative to transfer the electric power and the input signal S11 to corresponding destinations, respectively. In this instance, the input signal S11 is relayed to an internal circuit 23, and the electric power of the first high voltage level Vpp is transferred to an output node 24.

The control circuit comprises an input signal detecting circuit 25 operative to detect the input signal S11 appearing at the multipurpose input terminal 21 and to relay the input signal S11 to the internal circuit 23. Upon detection of the input signal S11, a detecting signal or a control signal S12 goes up to a certain positive voltage level; however, the detecting or control signal S12 remains in the ground voltage level in the absence of the input signal S11. The control circuit 22 further comprises an inverter circuit 26 operative to produce the inverse of the control signal S12, a charge-pump circuit 27, a gate transistor formed by an n-channel enhancement-mode MOS-type field effect transistor 28 coupled between the multipurpose input terminal 21 and the output node 24 and a transferring circuit 29 provided with two n-channel enhancement-mode MOS-type field effect transistors 30 and 31. In this instance, the charge-pump circuit 27 is provided with two gate transistors respectively formed by n-channel enhancementmode MOS-type field effect transistors 32 and 33 and a single-stage bootstrap circuit 34 coupled between the two gate transistors, and the bootstrap circuit 34 has a capacitor 35 and an n-channel enhancement MOS-type field effect transistor 36. The capacitor 35 is supplied with a clock signal CL swinging its voltage level between second high voltage level Vcc of about 5.0 volts and the ground level, however the clock signal CL may alter its voltage level between a voltage level supplied from the transferring circuit 29 and the ground level in another implementation. Though not shown in the drawings, the clock signal CL swinging its voltage level between the second high voltage level Vcc and the ground voltage level can be produced from an inverter circuit coupled between a source of the second high voltage level Vcc and the ground terminal and having a gate electrode applied with a clock signal supplied from the outside thereof. However, in another implementation, the inverter circuit is coupled between an output node of the transferring circuit 29 and the ground terminal and has an input node applied with the clock signal.

The transferring circuit 29 has an input node 37 coupled to the multipurpose input terminal 21 and an output node 38, and the n-channel enhancement-mode MOS-type field effect transistors 32 and 33 are respectively coupled between the output node 38 and the single-stage bootstrap circuit 34 and between the single-stage bootstrap circuit 34 and a ground terminal. The n-channel enhancement-mode MOS-type field effect transistors 32 and 33 have respective gate electrodes coupled in parallel to the output node and the input node of the inverter circuit 26, respectively. An output node 39 is provided between the single-stage bootstrap circuit 34 and the n-channel enhancement-mode MOS-type field effect transistor 33, and the output node 39 is coupled to respective gate electrodes of the n-channel enhancement-mode MOStype field effect transistors 28 and 30. However, the n-channel enhancement-mode MOS-type field effect transistor 31 has a gate electrode coupled to the multipurpose input terminal 21. In this instance, each of the n-channel enhancement-mode MOS-type field effect transistors 28, 30, 31, 32 and 33 has a threshold voltage of about 1.0 volt. The operation of the control circuit 22 now will be described, focusing upon an extremely high voltage level Vhh appearing at the output node of the charge-pump circuit 27. When the input signal S11 is supplied from the outside, the input signal detecting circuit 25 detects the input signal S11 and relays it to the internal circuit 23. Upon detection of the input signal S11, the control signal S12 goes up to the certain positive level, the inverter circuit 26 supplies the gate electrode of the n-channel enhancement-mode MOS-type field effect transistor 32 with the ground voltage level, so that the MOS-type field effect transistor 32 turns off the cut off the conduction path between the output node 38 and the single-stage bootstrap circuit 34. However, the control signal S12 is directly supplied to the gate electrode of the n-channel enhancement-mode MOS-type field effect transistor 33, then the ground voltage level is supplied to the output node 39 through the n-channel enhancementmode MOS-type field effect transistor 33. The ground voltage level is supplied from the output node 39 to the gate electrodes of the n-channel enhancement-mode MOS-type field effect transistors 28 and 30, so that the output node 24 is electrically isolated from the multipurpose input terminal 21 by the MOS-type field effect transistor 28 remaining in the off-state.

On the other hand, when the first high voltage level Vpp is supplied to the multipurpose input terminal 21, the input signal detecting circuit 25 does not relay the electric power of the first high voltage level Vpp to the internal circuit 23. With the first high voltage level Vpp, the n-channel enhancement-mode MOS-type field effect transistor 31 supplies the n-channel enhancement-mode MOS-type field effect transistor 32 and the inverter circuit 26 with a voltage level lower than the first high voltage level Vpp, and the n-channel enhancement-mode MOStype field effect transistor 28 is turned off in this stage. When the first high voltage level Vpp is supplied to the input signal detecting circuit 25, the control signal S12 goes down to the ground voltage level, and the inverter circuit 26 produces the inverse of the certain positive voltage level. The control signal S12 of the ground voltage level and the inverse thereof are supplied in parallel to the respective gate electrodes of the n-channel enhancement-mode MOS-type field effect transistors 33 and 32, respectively, then the output node 39 is blocked from the ground terminal but the single-stage bootstrap circuit 34 is activated with the slightly lower voltage level of about 11.5 volts. When the single-stage bootstrap circuit 34 is activated, the output node 39 is increased in voltage level toward a high voltage level Vhh'. The high voltage level Vhh' is calculated as follows $$Vhh' = (Vpp - Vth31) - Vth32 + Vcc - Vth36 = 14.5 \text{ volts}$$

where Vth31, Vth32 and Vth36 represent the respective threshold voltages of the n-channel enhancement-mode MOS-type field effect transistors 31, 32 and 36, respectively.

Thus, the output node 39 reaches a voltage level higher than the first high voltage level Vpp by the threshold voltage of the n-channel enhancement-mode MOS-type field effect transistor 28, then the MOS-type field effect transistor 28 turns on to provide the first high voltage level Vpp to both of the inverter circuit 26 and the n-channel enhancement-mode MOS-type field effect transistor 32. This results in further ascent in voltage level at the output node 39. Then, the high voltage level Vhh is calculated as follows $$Vhh = Vpp - Vth32 + Vcc - Vth36 = 15.5 \text{ volts}$$

When the n-channel enhancement-mode MOS-type field effect transistor 28 is supplied with the high voltage level Vhh, the MOS-type field effect transistor 28 fully turns on to transfer the first high voltage level Vpp of about 12.5 volts to the output node 24 without reduction in voltage level. Thus, the control circuit illustrated in FIG. 2 is capable of transferring the first high voltage level Vpp to the output node 24 without reduction in voltage level but is merely equipped with the single-stage bootstrap circuit 34, so that the occupation area of the control circuit 22 is drastically decreased in comparison with the prior-art control circuit.

As described hereinbefore, the clock signal CL alters its voltage level between the voltage level at the output node 38 and the ground voltage level in another implementation. In this situation, the charge-pump circuit 27 produces the high voltage level Vhh' calculated as follows $$Vhh' = (Vpp - Vth31) - Vth32 + (Vpp - Vth31) - Vth36 = 21.0 \text{ volts}$$

After the n-channel enhancement-mode MOS-type field effect transistor 30 turns on, the high voltage level Vhh is calculated as follows $$Vhh = Vpp - Vth32 + Vpp - Vth36 = 23.0 \text{ volts}$$

The n-channel enhancement-mode MOS-type field effect transistor 28 is fully turned on with the extremely high voltage level Vhh of about 23.0 volts, so that the voltage level at the output node 24 is perfectly stable.

Second Embodiment

Figure 3:
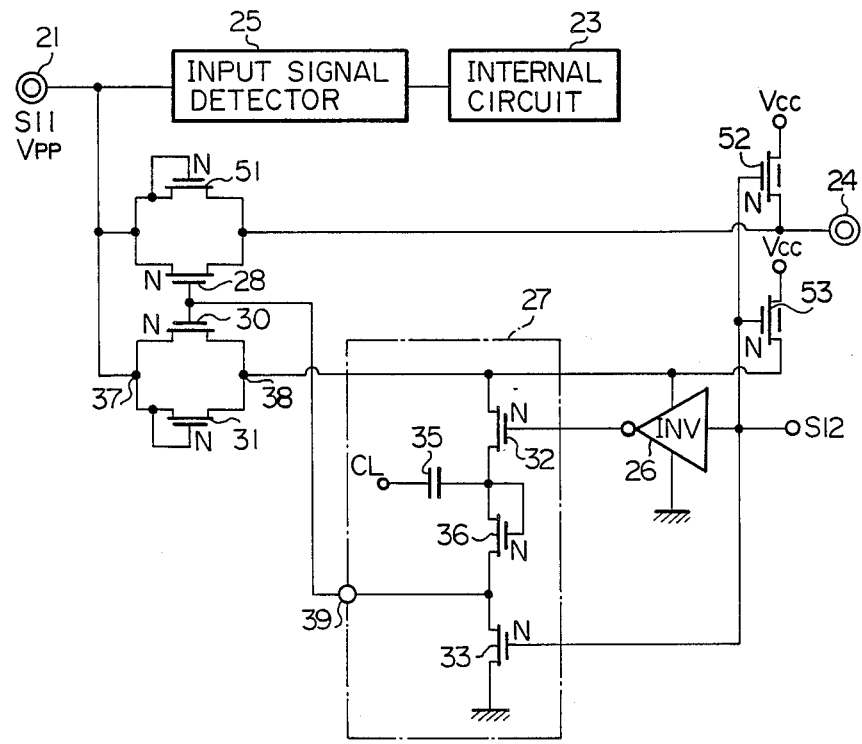
FIG. 3 is a diagram showing the circuit arrangement of an integrated circuit provided with another control circuit for a multipurpose input terminal embodying the present invention.

Turning to FIG. 3 of the drawings, the circuit arrangement of another integrated circuit equipped with a control circuit embodying the present invention is illustrated. The integrated circuit illustrated in FIG. 3 is similar in construction to the integrated circuit illustrated in FIG. 2 except for an n-channel enhancement-mode MOS-type field effect transistor 51 and two n-channel depletion-mode MOS-type field effect transistors 52 and 53, so that circuits and component elements corresponding to those of the integrated circuit shown in FIG. 3 are designated by like reference numerals and no further description is incorporated for the sake of simplicity. The control circuit 27 is also similar in operation to that incorporated in the integrated circuit illustrated in FIG. 2, and, for this reason, detailed description for the general function thereof will be omitted.

The function and additional advantages obtained by the MOS-type field effect transistors 51, 52 and 53 now will be decribed The n-channel enhancement-mode MOStype field effect transistor 51 is coupled in parallel to the MOS-type field effect transistor 28 between the multipurpose input terminal 21 and the output node 24 and has a gate electrode coupled to the multipurpose input terminal 21, so that the first high voltage level Vpp is immediately transferred to the output node 24 with reduction in voltage level by the threshold voltage of the MOS-type field effect transistor 51. Thus, the output node 24 is charged up to the voltage level slightly lower than the high voltage level prior to application of the extremely high voltage level Vhh to the gate electrode of the n-channel enhancement-mode MOS-type field effect transistor 28, so that the output node 24 rapidly reaches the high voltage level Vpp after the MOS-type field effect transistor fully turns on.

On the other hand, the n-channel depletion-mode MOS-type field effect transistors 52 and 53 are coupled in parallel between the source of the second high voltage level Vcc and the output nodes 24 and 38, respectively, and have respective gate electrodes commonly coupled to the input node of the inverter circuit 26 where the control signal S12 appears. The n-channel depletion-mode MOS-type field effect transistors 52 and 53 thus arranged are operative to clamp the voltage levels at the output nodes 24 and 38 to the second high voltage level Vcc in the presence of the input signal S11. This arrangement results in the positive high voltage level at the output nodes 24 and 38 during the relaying operation for the input signal S11, thereby causing the output nodes 24 and 38 to quickly increase in voltage level upon application of the electric power of the first high voltage level Vpp.

Third Embodiment

Figure 4:
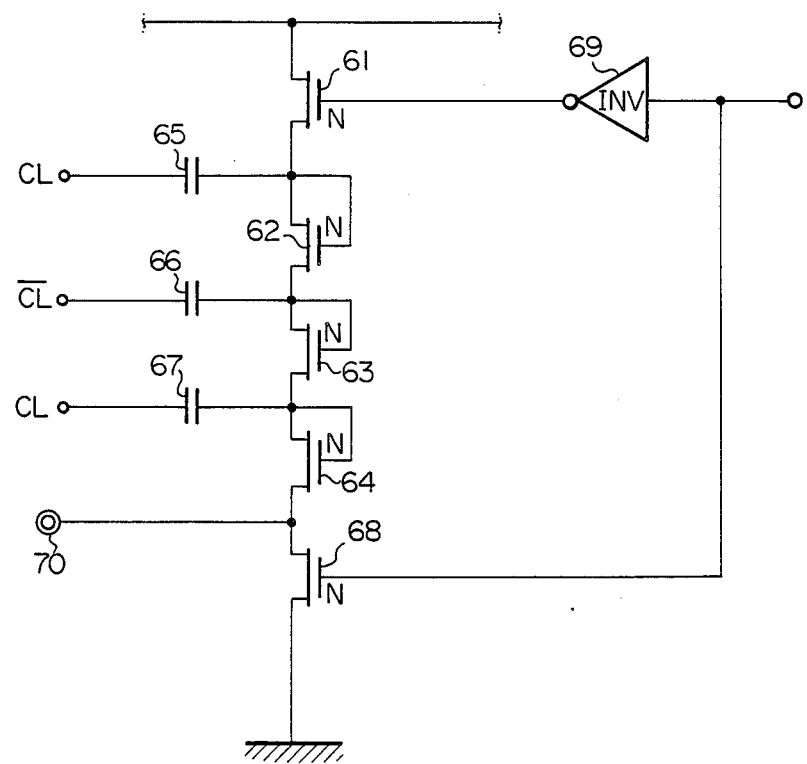
FIG. 4 is a diagram showing the circuit arrangement of a control circuit incorporated in still another integrated circuit.

Turning to FIG. 4 of the drawings, there is shown the circuit arrangement of another control circuit for a multipurpose input terminal according to the present invention. The control circuit illustrated in FIG. 4 is incorporated in an integrated circuit similar in construction to that shown in FIG. 2 and largely comprises a gate transistor 61, and three-stages of bootstrap circuits each provided with an n-channel enhancement-mode MOS-type field effect transistor 62, 63 or 64 and a capacitor 65, 66 or 67, and a gate transistor 68. The gate transistors 61 and 68 are formed by n-channel enhancement-mode MOS-type field effect transistors, respectively, and have respective gate electrodes coupled in parallel to input and output nodes of an inverter circuit 69 which corresponds to the inverter circuit 26. A clock signal CL and a complementary clock signal thereof are supplied to the capacitors 65 and 67 and the capacitor 66, so that an extremely high voltage level appears at an output node 70 as a result of the bootstrap operations.

Although particular embodiments of the present invention have been shown and described, it will be obvious to those skilled in the art that various changes and modifications may be made without departing from the spirit and scope of the present invention.

What is claimed is:

1. A control circuit for a multipurpose input terminal incorporated in an integrated circuit, said multipurpose input terminal being supplied with an input signal or an electric power different in voltage level from the input signal, comprising:

(a) an input signal detecting circuit operative to detect said input signal appearing at said multipurpose input terminal for relaying the input signal to an internal circuit;

(b) a first gate transistor responsive to a first control signal for providing a conduction path between said multipurpose input terminal and an output node and having a threshold voltage;

(c) a charge-pump circuit carrying out a bootstrap operation in the presence of said electric power for producing said first control signal higher in voltage level than said electric power by at least the threshold voltage of said first gate transistor, said charge-pump circuit including a series combination of a second gate transistor, at least one bootstrap circuit and a third gate transistor coupled between a power node and a reference voltage source;

(d) a transferring circuit operative to supply said power node with said electric power used for said bootstrap operation; and (e) control means responsive to a second control signal shifting between first and second levels for controlling said second and third gate transistors, said control means complementarily making said second and third gate transistors conductive and non-conductive, respectively, thereby allowing said first gate transistor to be conductive in the presence of said second control signal of the first level and to be non-conductive in the presence of said second control signal of the second level.

2. A control circuit for a multipurpose input terminal incorporated in an integrated circuit, said multipurpose input terminal being supplied with an input signal or an electric power different in voltage level from the input signal, comprising:

(a) an input signal detecting circuit operative to detect said input signal appearing at said multipurpose input terminal for relaying the input signal to an internal circuit;

(b) a first gate transistor responsive to a first control signal for providing a conduction path between said multipurpose input terminal and an output node and having a threshold voltage;

(c) a charge-pump circuit carrying out a bootstrap operation in the presence of said electric power for producing said first control signal higher in voltage level than said electric power by at least the threshold voltage of said first gate transistor;

(d) a transferring circuit operative to supply said charge-pump circuit with said electric power used for said bootstrap operation; and (e) an inverter circuit supplied with a second control signal for producing the inverse thereof, in which said charge-pump circuit comprises a series combination of a second gate transistor, at least one bootstrap circuit and a third gate transistor coupled between an output node of said transferring circuit and a source of constant voltage producing a constant voltage different in voltage level from said input signal and said electric power, said second and third gate transistors having respective gate electrodes coupled to output and input nodes of said inverter circuit, respectively.

3. A control circuit for a multipurpose input terminal incorporated in an integrated circuit, said multipurpose input terminal being supplied with an input signal or an electric power different in voltage level from the input signal, comprising:

(a) an input signal detecting circuit operative to detect said input signal appearing at said multipurpose input terminal for relaying the input signal to an internal circuit;

(b) a first gate transistor responsive to a first control signal for providing a conduction path between said multipurpose input terminal and an output node and having a threshold voltage;

(c) a charge-pump circuit carrying out a bootstrap operation in the presence of said electric power for producing said first control signal higher in voltage level than said electric power by at least the threshold voltage of said first gate transistor;

(d) a transferring circuit operative to supply said power node with said electric power used for said bootstrap operation; and (e) an inverter circuit supplied with a second control signal for producing the inverse thereof, said charge-pump circuit comprising a series combination of a second gate transistor, at least one bootstrap circuit and a third gate transistor coupled between a power node and a source of constant voltage producing a constant voltage different in voltage level from said input signal and said electric poewr, said second and third gate transistors having respective gate electrodes coupled to output and input nodes of said inverter circuit, respectively, wherein said bootstrap circuit is supplied with a clock signal swinging its voltage level between a voltage level appearing at the output node of said transferring circuit and said constant voltage.

4. A control circuit for a multipurpose input terminal incorporated in an integrated circuit, said multipurpose input terminal being supplied with an input signal or an electric power different in voltage level from the input signal, comprising:

(a) an input signal detecting circuit operative to detect said input signal appearing at said multipurpose input terminal for relaying the input signal to an internal circuit;

(b) a first gate transistor responsive to a first control signal for providing a conduction path between said multipurpose input terminal and an output node and having a threshold voltage;

(c) a charge-pump circuit carrying out a bootstrap operation in the presence of said electric power for producing said first control signal higher in voltage level than said electric power by at least the threshold voltage of said first gate transistor;

(d) a transferring circuit operative to supply said charge-pump circuit with said electric power used for said bootstrap operation; and (e) an inverter circuit supplied with a second control signal for producing the inverse thereof, wherein said charge-pump circuit comprises a series combination of a second gate transistor, at least one bootstrap circuit and a third gate transistor coupled between an output node of said transferring circuit and a source of constant voltage producing a constant voltage different in voltage level from said input signal and said electric power, said second and third gate transistor having respective gate electrodes coupled to output and input nodes of said inverter circuit, respectively, and wherein said transferring circuit comprises a first load transistor and a fourth gate transistor coupled in parallel between said multipurpose input terminal and said charge-pump circuit and wherein said fourth gate transistor is supplied with said first control signal from said charge-pump circuit.

5. A control circuit as set forth in claim 4, in which said first load transistor has a gate electrode coupled to said multipurpose input terminal.

6. A control circuit as set forth in claim 5, in which said control circuit further comprises a second load transistor coupled in parallel to said first gate transistor between said multipurpose input terminal and said output node and in which said second load transistor has a gate electrode coupled to said multipurpose input terminal.

7. A control circuit as set forth in claim 6, in which said bootstrap circuit comprises an n-channel enhancement-mode field effect transistor connected between said second and third gate transistors at first and second nodes, respectively, and having a gate connected to said first node, and a capacitor supplied at one electrode thereof with said clock signal and having the other electrode coupled to the gate of said enhancement-mode transistor.

8. A control circuit as set forth in claim 6, in which each of said first to fourth gate transistors is formed by an n-channel enhancement-mode field effect transistor and in which each of said first and second load transistors is formed by an n-channel enhancement-mode MOS-type field effect transistor.

9. A control circuit as set forth in claim 8, in which said control circuit further comprises a first n-channel depletionmode field effect transistor coupled between said output node and a positive constant voltage source producing a positive constant voltage level different in voltage level from said electric power and having a gate electrode coupled to the input node of said inverter circuit.

10. A control circuit as set forth in claim 8, in which said control circuit further comprises a second n-channel depletionmode field effect transistor coupled between said output node of said transferring circuit and a positive constant voltage source producing a positive constant voltage level different in voltage level from said electric power and having a gate electrode coupled to the input node of said inverter circuit.

11. A control circuit for a multipurpose input terminal incorporated in an integrated circuit, said multipurpose input terminal being supplied with an input signal or an electric power different in voltage level from the input signal, comprising:
  (a) an input signal detecting circuit operative to detect said input signal appearing at said multipurpose input terminal for relaying the input signal to an internal circuit;
  (b) a first gate transistor responsive to a first control signal for providing a conduction path between said multipurpose input terminal and an output node and having a threshold voltage;
  (c) a charge-pump circuit carrying out a bootstrap operation in the presence of said electric power for producing said first control signal higher in voltage level than said electric power by at least the threshold voltage of said first gate transistor;
  (d) a transferring circuit operative to supply said charge-pump circuit with said electric power used for said bootstrap operation; and
  (e) an inverter circuit supplied with a second control signal for producing the inverse thereof, in which said charge-pump circuit comprises a series combination of a second gate transistor, a multi-stage bootstrap circuit and a third gate transistor coupled between an output node of said transferring circuit and a source of constant voltage producing a constant voltage different in voltage level from said input signal and said electric power, said second and third gate transistors having respective gate electrodes coupled to output and input nodes of said inverter circuit, respectively.

12. A control circuit for an input terminal incorporated in an integrated circuit, said input terminal being supplied with an input signal or an electric power different in voltage level from the input signal, comprising:
  (a) a first gate transistor responsive to a first control signal for providing a conduction path between said input terminal and an output node and having a threshold voltage;
  (b) a charge-pump circuit carrying out a bootstrap operation in the presence of said electric power for producing said first control signal higher in voltage level than said electric power by at least the threshold voltage of said first gate transistor, said charge-pump circuit comprising a series combination of a second gate transistor, at least one bootstrap circuit and a third gate transistor coupled between a power node and a source of constant voltage producing a constant voltage different in voltage level from said input signal and said electric power, said second and third gate transistors having respective gate electrodes coupled to output and input nodes of said inverter circuit, respectively;
  (c) a transferring circuit operative to supply said power node with said electric power used for said bootstrap operation; and
  (d) an inverter circuit supplied with a second control signal for producing the inverse thereof, wherein said bootstrap circuit is supplied with a clock signal swinging its voltage level between a voltage level appearing at the output node of said transferring circuit and said constant voltage.

* * * * *

UNITED STATES PATENT AND TRADEMARK OFFICE
CERTIFICATE OF CORRECTION

PATENT NO. : 4,876,462

DATED : October 24, 1989

INVENTOR(S) : Hiroyuki Kobatake et al

It is certified that error appears in the above-identified patent and that said Letters Patent is hereby corrected as shown below:

Column 2, line 31, delete "enhancementmode" and insert --enhancement-mode-- lines 51 and 52, delete "in recessary" and insert --is necessary--

Column 5, line 34, delete "MOStype" and insert --MOS-type-- line 58, delete "enhancementmode" and insert --enhancement-mode--

Column 6, lines 66 and 67, delete "Vth3-6" and insert --Vth36--

Column 7, line 29, delete "decribed" and insert --described--

UNITED STATES PATENT AND TRADEMARK OFFICE
CERTIFICATE OF CORRECTION

PATENT NO. : 4,876,462

DATED : October 24, 1989

INVENTOR(S) : Hiroyuki Kobatake, et al

It is certified that error appears in the above-identified patent and that said Letters Patent is hereby corrected as shown below:

Column 10, line 58, delete "depletionmode" and insert --depletion-mode-- line 66, delete "depletionmode" and insert --depletion-mode--

Signed and Sealed this

Twenty-third Day of October, 1990

Attest:

HARRY F. MANBECK, JR.

*Attesting Officer*   *Commissioner of Patents and Trademarks*